US012617286B2

(12) United States Patent
Sobierajski et al.

(10) Patent No.: US 12,617,286 B2
(45) Date of Patent: May 5, 2026

(54) VEHICLE CONTROL SYSTEM

(71) Applicant: Transportation IP Holdings, LLC, Norwalk, CT (US)

(72) Inventors: Jennifer Sobierajski, Erie, PA (US); Jeffrey John Wolff, Erie, PA (US); Timothy Warren Brown, Erie, PA (US); Henry Todd Young, Erie, PA (US); Ibrahim Kacar, Erie, PA (US)

(73) Assignee: Transportation IP Holdings, LLC, Norwalk, CT (US)

( * ) Notice: Subject to any disclaimer, the term of this patent is extended or adjusted under 35 U.S.C. 154(b) by 273 days.

(21) Appl. No.: 18/358,593

(22) Filed: Jul. 25, 2023

(65) Prior Publication Data

US 2024/0092178 A1 Mar. 21, 2024

Related U.S. Application Data

(60) Provisional application No. 63/407,020, filed on Sep. 15, 2022.

(51) Int. Cl.
B60L 3/12 (2006.01)
B60L 5/18 (2006.01)
(Continued)

(52) U.S. Cl.
CPC ................. B60L 3/12 (2013.01); B60L 50/53 (2019.02); G01R 19/16571 (2013.01);
(Continued)

(58) Field of Classification Search
USPC .......................................................... 701/22
See application file for complete search history.

(56) References Cited

U.S. PATENT DOCUMENTS

| | | | | |
|---|---|---|---|---|
| 9,008,879 B2 * | 4/2015 | Kumar | ................... | B60L 58/19 |
| | | | | 701/22 |
| 2014/0305924 A1 * | 10/2014 | Uchtmann | ............. | H05B 3/146 |
| | | | | 219/535 |
| 2021/0221229 A1 * | 7/2021 | Wang | ........................ | B60L 5/38 |

FOREIGN PATENT DOCUMENTS

| | | | | |
|---|---|---|---|---|
| CN | 109484189 B | 10/2020 | | |
| EP | 3623202 A1 * | 3/2020 | ............... | B60L 9/00 |
| PL | 203907 B1 | 11/2009 | | |

OTHER PUBLICATIONS

European Search Report dated Feb. 19, 2024 for corresponding European Patent Application No. 23194126.1.

* cited by examiner

*Primary Examiner* — Adam D Tissot
(74) *Attorney, Agent, or Firm* — K&L Gates LLP

(57) ABSTRACT

Systems and methods for controlling operation of a vehicle system are provided. This vehicle system can be at least partially powered by electric current conducted to a collector device of the vehicle system from a conductive pathway extending along a route traveled by the vehicle system. A voltage level of the conductive pathway may be monitored, and a conduction impaired location of the conductive pathway may be identified based at least in part on the voltage level of the conductive pathway that is monitored. The collector device or a removal device may be controlled to remove a contaminant from the conductive pathway at the conduction impaired location, the vehicle system may be controlled to compensate for the conduction impaired location, and/or an off-board facility and/or another vehicle system may be notified of the conduction impaired location responsive to identifying the conduction impaired location.

18 Claims, 3 Drawing Sheets

300

Monitor characteristics of conductive pathway and/or ambient conditions — 302

Identify conduction impaired location — 304

Condition segment of conductive pathway that includes the conduction impaired location and/or change control of the vehicle system during movement through the conduction impaired location — 306

(51) Int. Cl.
　　　B60L 50/53　　　　　　(2019.01)
　　　G01R 19/165　　　　　(2006.01)
(52) U.S. Cl.
　　　CPC .......... G01R 19/16576 (2013.01); B60L 5/18
　　　　　　　　　　(2013.01); B60L 2240/421 (2013.01)

300

Monitor characteristics of conductive pathway and/or ambient conditions — 302

Identify conduction impaired location — 304

Condition segment of conductive pathway that includes the conduction impaired location and/or change control of the vehicle system during movement through the conduction impaired location — 306

VEHICLE CONTROL SYSTEM

CROSS-REFERENCE TO RELATED APPLICATIONS

This application claims priority to U.S. Provisional Application No. 63/407,020 (filed 15 Sep. 2022), the entire disclosure of which is incorporated herein by reference.

BACKGROUND

Technical Field

The subject matter described herein relates to control systems that control operation of vehicles that are at least partially powered from an off-board power source and the conditioning of conductive pathways that supply electric power to the vehicles from the power source.

Discussion of Art

Some vehicle systems are powered with electric power supplied by a power supply system that uses conductive pathways extending along routes of the vehicle systems. For example, some mining vehicles, rail vehicles, buses, and the like, may have pantographs that contact overhead catenaries to receive electric power from an off-board source. As another example, some rail vehicles include conductive shoes that engage an electrified rail to receive power from the off-board source.

One issue with the vehicle systems and the power supply systems is that portions of the conductive pathways may not always be able to supply a consistent amount of electric energy (e.g., voltage, current, power, etc.) to the vehicle systems. For example, one or more portions of the catenaries or electrified rails may be covered in ice, dirt, debris, or corrosion, may be too far from the vehicle systems when the road bed has deteriorated, etc. When the vehicle systems encounter such a portion of the conductive pathway, loads of the vehicle systems may begin receiving intermittent, decreased, or no energy from the conductive pathways. This can significantly hamper operation of the loads, such as the motors that propel the vehicles, especially when the power supplied by the conductive pathways to the motors suddenly decreases (when the portion is encountered) and/or suddenly increases (when the portion is passed).

It may be desirable to have a system and method that differs from those that are currently available.

BRIEF DESCRIPTION

In one example, a method for controlling operation of a vehicle system is provided. This vehicle system can be at least partially powered by electric current conducted to a collector device of the vehicle system from a conductive pathway extending along a route traveled by the vehicle system. The method may include monitoring a voltage level of the conductive pathway and identifying a conduction impaired location of the conductive pathway based at least in part on the voltage level of the conductive pathway that is monitored. The method also may include controlling the collector device or a removal device to remove a contaminant from the conductive pathway at the conduction impaired location, controlling the vehicle system to compensate for the conduction impaired location, and/or notifying at least one of an off-board facility or another vehicle system of the conduction impaired location responsive to identifying the conduction impaired location.

In another example, another method is provided and includes receiving notifications from vehicle systems traveling along routes having conductive pathways extending along the routes. The notifications may identify locations along the conductive pathways or along the routes where decreases in voltage conducted along the conductive pathways were sensed by the vehicle systems. The method also may include examining one or more characteristics of the voltage or the decreases in the voltage that were sensed by the vehicle systems, and directing the vehicle systems or one or more additional vehicles how to move through at least one of the locations that were identified based on the one or more characteristics of the voltage or the decreases in the voltage.

In another example, a vehicle control system is provided that may include a sensor or receive information from the sensor onboard a vehicle system (without the control system including the sensor) to monitor a voltage conducted along a conductive pathway extending along a route while the vehicle system moves along the route. The sensor may monitor the voltage conducted along the conductive pathway that also powers a propulsion system of the vehicle system via a collector device of the vehicle system. The control system may include a controller that may identify a conduction impaired segment of the conductive pathway based on the voltage that is monitored by the sensor. The controller may control the collector device to remove a contaminant on the conducive pathway, control a removal device of the vehicle system to remove the contaminant on the conducive pathway, control the vehicle system to power the propulsion system using a different energy source than the conductive pathway, and/or control the vehicle system to account for a change in grade of the route, responsive to identifying the conduction impaired segment of the conductive pathway.

BRIEF DESCRIPTION OF THE DRAWINGS

The subject matter may be understood from reading the following description of non-limiting embodiments, with reference to the attached drawings, wherein below.

DETAILED DESCRIPTION

Embodiments of the subject matter described herein relate to vehicle control systems that can detect conduction impaired portions of conductive pathways that are less conductive, and then condition the pathways to increase the conductivity of the pathways in the portions, change operation of the vehicle systems to decrease or eliminate negative impacts caused by encountering the portions, and/or notify other systems (e.g., other vehicle systems, maintenance facilities, etc.) to warn of the portions. In one example, a conduction impaired portion, location, segment, etc. of the conductive pathway may include a segment of the pathway having a contaminant on the pathway, such as ice, dirt, other debris, corrosion (e.g., rust), or the like, that results in that segment of the conductive pathway being less conductive with a collector device of a vehicle system (e.g., a pantograph, conductive shoe, etc.) than one or more (or all) other segments of the pathway not having the contaminant. In another example, a less conductive portion of the conductive pathway may include a segment of the pathway that is less conductive with the collector device of the vehicle system due to the collector device and pathway being spaced apart from each other, such as due to the roadbed dipping away from the pathway and the collector device cannot reach the pathway.

While one or more embodiments are described in connection with a mining vehicle system or a rail vehicle system, not all embodiments are limited to rail vehicle systems. Unless expressly disclaimed or stated otherwise, the subject matter described herein extends to other types of vehicle systems, such as automobiles, trucks (with or without trailers), buses, agricultural vehicles, or other off-highway vehicles. The vehicle systems described herein (mining vehicles, rail vehicle systems, or other vehicle systems that do not travel on rails or tracks) may be formed from a single vehicle or multiple vehicles. With respect to multi-vehicle systems, the vehicles may be mechanically coupled with each other (e.g., by couplers) or logically coupled but not mechanically coupled. For example, vehicles may be logically but not mechanically coupled when the separate vehicles communicate with each other to coordinate movements of the vehicles with each other so that the vehicles travel together (e.g., as a convoy).

Figure 1:
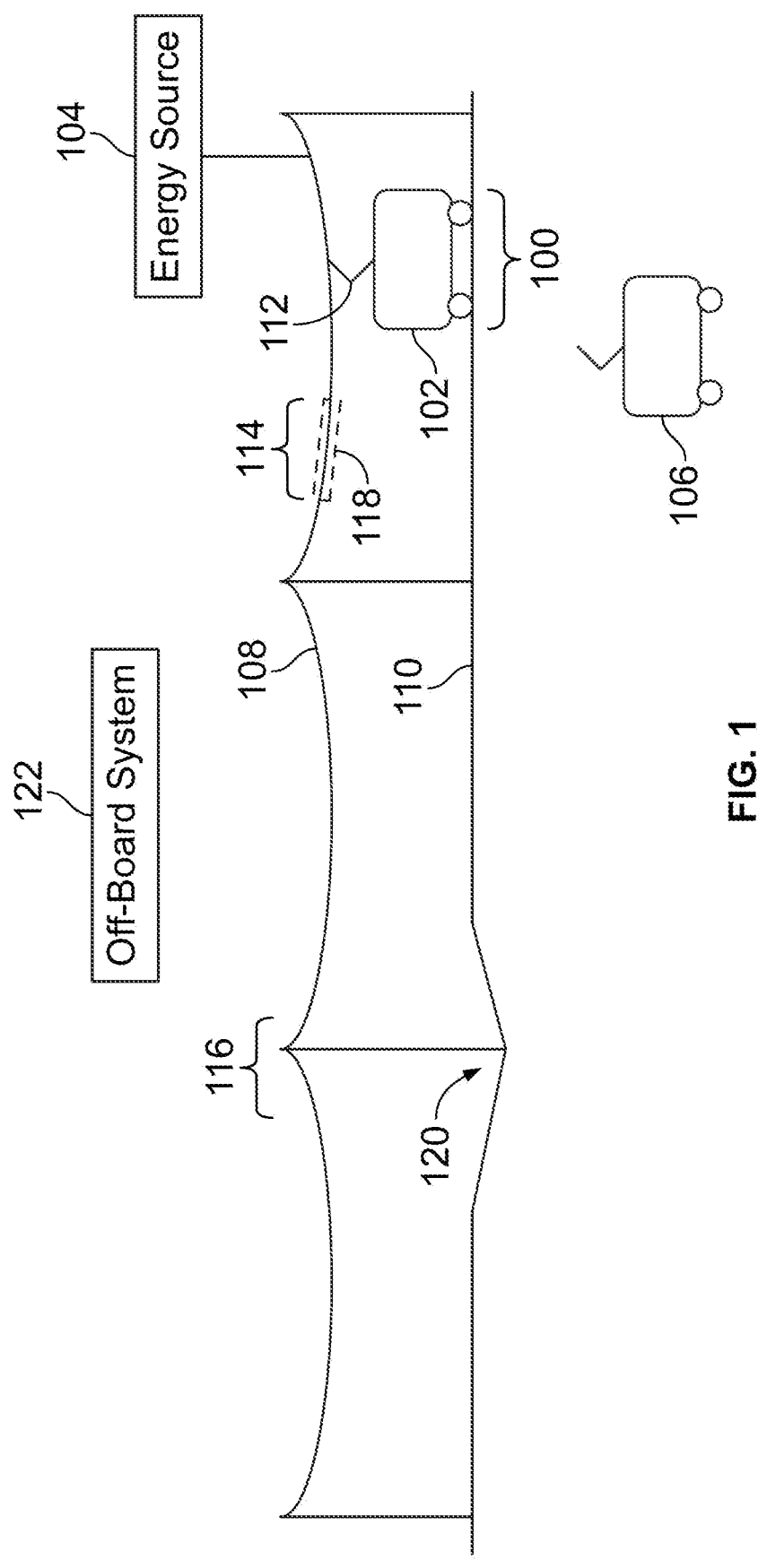
FIG. 1 illustrates one example of a vehicle control system.

FIG. 1 illustrates one example of a vehicle control system 100. The control system may be partially or entirely disposed onboard a vehicle system 102. The vehicle system can be formed of a single vehicle or multiple vehicles, as described above. The vehicle system may be at least partially powered by an off-board energy source 104, such as a utility grid, generator, solar panels, etc., that conduct electric energy to the vehicle system (and potentially additional vehicle systems 106, which may be the same as or similar to the vehicle system 102) via a conductive pathway 108. The conductive pathway may extend along routes 110 on which the vehicle systems travel. For example, the conductive pathway may be an overhead catenary (shown in FIG. 1), an electrified rail (e.g., represented by the route in FIG. 1 in embodiments that include an electrified rail), or the like. The routes may represent mining paths, tracks (that may or may not include the conductive pathway), roads, or the like.

The off-board energy source may apply a potential to the conductive pathway such that the conductive pathway has an elevated voltage (e.g., relative to a ground reference, such as the catenary or electrified rail carrying a direct current or voltage of at least 700 volts). Optionally, the off-board energy source may apply an alternating current to the conductive pathway.

Figure 2:
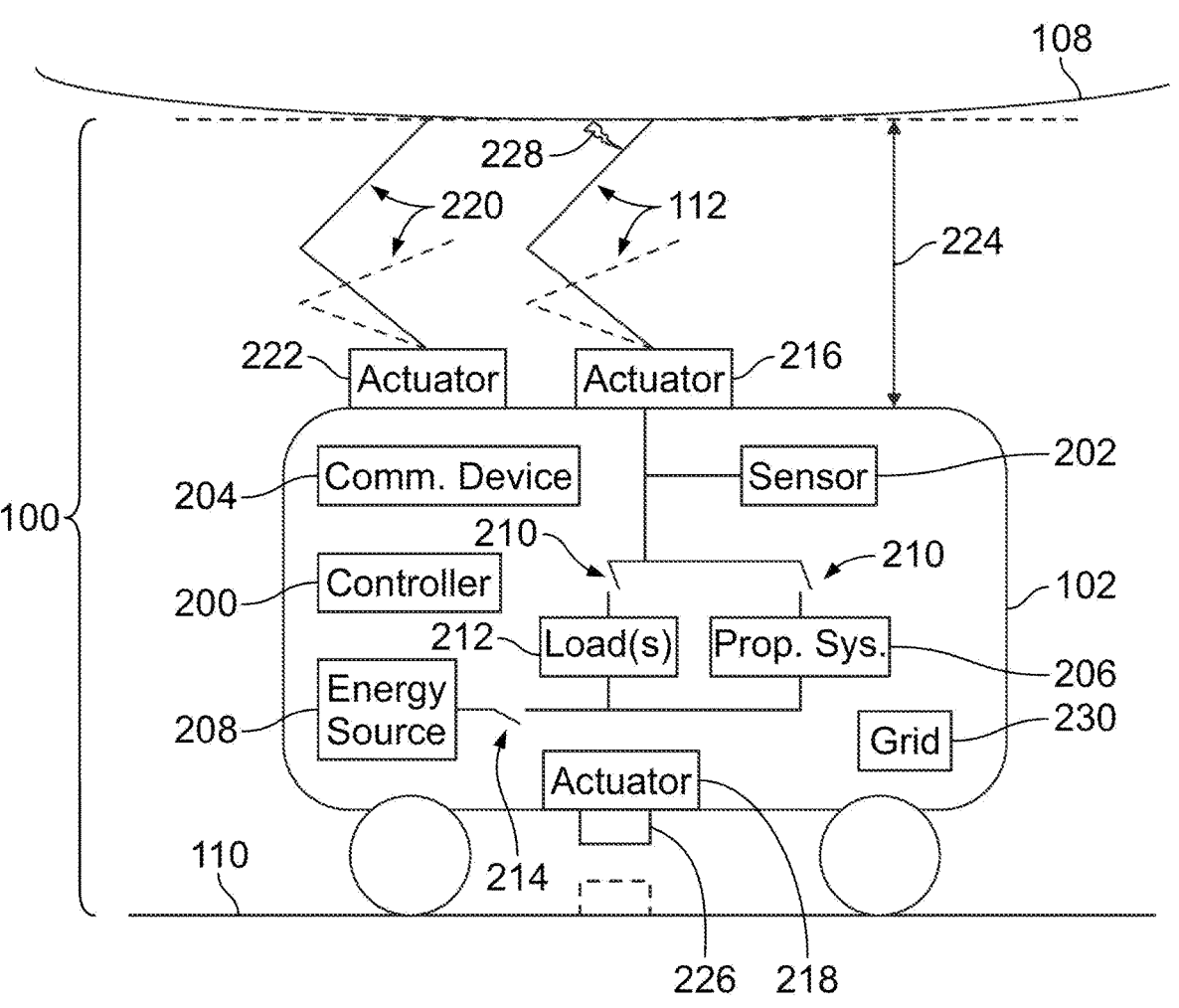
FIG. 2 illustrates one example of components of the control system shown in FIG. 1 onboard a vehicle system.

The vehicle system may include a collector device 112 that engages the conductive pathway to conduct the electric energy (e.g., the voltage or alternatively the alternating current) from the conductive pathway to one or more loads of the vehicle system. These loads can include propulsion loads that propel the vehicle system (e.g., motors), auxiliary loads (e.g., heating, ventilation, and air conditioning systems; communication devices; onboard displays; etc.) of the vehicle system, or the like. The collector device may represent a pantograph that engages an overhead catenary, but also may represent a conductive shoe that engages an electrified rail of the route, to receive the electric energy conducted from the off-board energy source to the load(s) of the vehicle system. One example of a conductive shoe 226 is shown in FIG. 2 is both a raised position (solid lines) and a lowered position (broken lines).

During travel along the routes, the vehicle systems may encounter one or more conduction impaired portions 114, 116 of the conductive pathway. Some conduction impaired portions 114 may represent sections of the pathway having contaminants 118 (e.g., contaminated portions) while other conduction impaired portions 116 may represent sections of the pathway and/or the route that are too far from the vehicle system or route for the collector device to engage the pathway (e.g., due to a dip 120 in the route caused by deterioration of the route, ballast beneath the route, etc.). Travel beneath or above these conduction impaired portions 114, 116 may result in a drop or decrease in the electric energy conducted to the loads of the vehicle system from the off-board energy source via the conductive pathway. For example, the ice, dirt, debris, corrosion, or the like, that is on the outside of the conductive pathway may increase the electrical resistance and/or create an insulating layer between the collector device and the conductive pathway. As another example, the spatial separation of the conductive pathway and the collector device may prevent conduction of the electric energy in or conducted by the conductive pathway and the collector device.

If operation of the vehicle system is not changed and/or the conductive pathway is not conditioned to remove or alleviate the impact of the conduction impaired portion, for example, the propulsion system of the vehicle system may suddenly have insufficient power to continue propelling the vehicle system, and the vehicle system may suddenly stop or slow down, thereby creating a potentially unsafe movement. As another example, once the vehicle system moves through the conduction impaired portion, the collector device may receive an onrush or sudden increase in voltage from the conductive pathway. This sudden increase can cause the vehicle system to suddenly lurch forward or otherwise move in an unsafe manner. Additionally, the onrush of voltage may damage one or more electronic components onboard the vehicle system.

The control system may perform one or more operations to safely control the vehicle system while moving through the conduction impaired portion and/or to condition the conductive pathway and reduce or remove the conduction impaired portion. Optionally, the control system may communicate with other vehicle systems to warn of the conduction impaired portion and/or with an off-board system 122 (e.g., a maintenance facility, dispatch facility, etc.) to notify the off-board system of the location of the conduction impaired portion for maintenance, inspection, etc.

With continued reference to the control system shown in FIG. 1, FIG. 2 illustrates one example of components of the control system onboard the vehicle system. The control system includes a controller 200 onboard the vehicle system. This controller can represent hardware circuitry that includes and/or is connected with one or more processors (e.g., microprocessors, integrated circuits, field programmable gate arrays, etc.) that perform the operations described in connection with the controller. The control system may include one or more sensors 202 that monitor, measure, or otherwise sense characteristics of components such as the conductive pathway, the collector device, the vehicle system, etc. As one example, the sensors may measure an energy level of the conductive pathway. This can include a voltmeter or other device that measures the potential or voltage of the conductive pathway. The controller can receive output from the sensors indicating the voltage (or other energy) level of the conductive pathway as the vehicle system moves along the route. The controller can identify the location of a conduction impaired location or portion of the conductive pathway based on one or more changes to the monitored energy level (e.g., voltage). For example, responsive to the voltage decreasing below a threshold amount, the voltage decreasing by more than a threshold change, or the like, the controller may determine that the collector device has encountered (e.g. contacted) a conduction impaired location along the conductive pathway. The controller may then implement or perform one or more actions in response to detecting the conduction impaired location of the conductive pathway.

As another example, the sensor(s) can measure the ambient temperature, humidity, or the like, to determine whether ambient conditions indicate an increased likelihood of contaminants on the conductive pathway (e.g., ice, corrosion such as rust, etc.). Responsive to the temperature being colder than a threshold temperature and/or the humidity being above a threshold humidity, the controller may determine that the collector device has encountered or is likely to encounter a conduction impaired location along the conductive pathway. The controller may then implement or perform one or more actions in response to detecting the conduction impaired location of the conductive pathway.

As another example, the sensor(s) can include optical sensors, such as cameras, infrared sensors, or the like, that examine the conductive pathway for contaminants. Responsive to optically detecting a contaminant, the controller may determine that the collector device has encountered or is likely to encounter a conduction impaired location along the conductive pathway. The controller may then implement or perform one or more actions in response to detecting the conduction impaired location of the conductive pathway.

These responsive actions can include controlling the collector device to remove a contaminant from the conductive pathway, controlling or changing control of the vehicle system (e.g., to compensate for a change in grade of the route, to compensate for the loss or reduction of off-board power, etc.), notifying the off-board system of the conduction impaired location, notifying another vehicle system of the conduction impaired location, etc. With respect to the notification actions, the controller can direct a communication device 204 to send signals to the off-board system or other vehicle system that include information indicative of the location of the conduction impaired location and/or the degree of the impairment to conduction of the conductive pathway. The degree of impairment can represent how much the voltage in the conductive pathway decreased relative to one or more segments or locations of the conductive pathway outside of (e.g., ahead) of the conduction impaired location or segment, an average or median of the voltages measured in the conduction impaired location or segment, or the like. The communication device can represent transceiving circuitry, such as one or more transceivers, modems, antennas, or the like.

The notification can allow other vehicle systems to prepare for travel through the conduction impaired location (to remove or remediate the location, as described herein) or to change paths or routes to avoid the conduction impaired location. The notification can allow the off-board system to dispatch maintenance crews to inspect, repair, clean, etc. the conductive pathway and/or the route to fix or eliminate the conduction impaired location (e.g., by melting the ice, by cleaning the dirt or debris, by adding ballast or material to the route to eliminate dips in the route, etc.).

With respect to controlling or changing how the vehicle system is controlled responsive to encountering a conduction impaired location or section, the controller can switch to powering loads (e.g., a propulsion system 206 ("Prop. Sys." in FIG. 2), which can represent one or more traction motors and associated circuitry) using an onboard energy source 208, or can supplement the reduced energy from the conductive pathway with increased energy from the onboard energy source and/or onboard energy storage. The onboard energy source can represent one or more battery cells, strings, packs, modules, etc.; one or more fuel cells; one or more capacitor banks; one or more flywheels; etc.

For example, responsive to detecting or identifying the conductive impaired location, the controller can switch operating modes of the vehicle system by activating one or more switches 210 to open the one or more switches and interrupt a connection between the collector device and the propulsion system and/or one or more loads 212 of the vehicle system. These loads may be additional propulsion loads and/or auxiliary loads of the vehicle system. The controller can concurrently, simultaneously, or sequentially also activate one or more other switches 214 to close these switches and establish or re-establish a connection between the onboard energy source and the loads and/or the propulsion system of the vehicle system. The onboard energy source can then supply electric power (e.g., voltage and/or alternating current) to the loads and/or the propulsion system. This can replace the energy previously received by the loads and/or the propulsion system from the conductive pathway. Optionally, instead of opening the switches between the collector device and the loads and/or between the collector device and the propulsion system, the controller can keep the switches 210 closed and also close the switches 214 to augment the energy received from the conductive pathway with the energy from the onboard energy source. In another example, the controller can duty cycle, or repeatedly open and close the switches 210 and/or 214 to supply energy from the conductive pathway and/or the onboard energy source during travel through the conductive impaired location or segment.

The controller can continue monitoring the measurements or output from the sensor to determine whether the collector device is no longer contacting the conduction impaired location or region. For example, once the measured voltage of the conductive pathway is determined to increase above a threshold or increase by more than a threshold amount, the controller may switch operating modes of the vehicle system and stop using the onboard energy source (e.g., by opening the switches 214 and closing, or keeping closed, the switches 210). Although FIG. 2 shows the switches being used with the collector device above the vehicle (e.g., a pantograph), the switches optionally can be connected with the collector device below or to the side of the vehicle (e.g., a conductive shoe) to operate in a similar manner.

With respect to the control system conditioning the conductive pathway responsive to identifying or detecting the conduction impaired section, the controller may move or direct movement of the collector device relative to the conductive pathway (and/or the vehicle system) to remove, partially remove, or disrupt the contaminant on the conductive pathway. The collector device may be connected with an actuator 216, 218, such as a motor, robotic arm, etc. The controller can direct the actuator to raise or lower the collector device toward the conductive pathway responsive to detection of the conduction impaired location. The collector device above the vehicle system is shown in solid lines in a raised position and in broken lines in a lowered position. The actuator 216 may lift, raise, or extend the collector device away from the vehicle system and toward the conductive pathway. This may cause the end or another part of the collector device to engage the conductive pathway (e.g., the catenary), and potentially impart a scraping force onto the conductive pathway, as the vehicle system continues to move. As another example, the actuator 218 may lower, drop, or extend the collector device away from the vehicle system and toward the conductive pathway. This may cause the end or another part of the collector device to engage the conductive pathway (e.g., the electrified rail), and potentially impart a scraping force onto the conductive pathway, as the vehicle system continues to move. These scraping forces may partially remove, fully remove, or at least perturb the contaminant on the conductive pathway (to thereby eliminate or reduce the degree or impact of the conduction impaired location).

Optionally, the control system may include a removal device 220 that is separate from the collector device. This removal device may include a scraper or blade edge that can be raised or lowered by another actuator 222 to contact the conductive pathway. The removal device is shown in FIG. 2 in solid lines in a raised or engaged position (e.g., to engage and scrape the conductive pathway) and in broken lines in a lowered or disengaged position (e.g., to not engage or contact the conductive pathway). The controller can direct this actuator to move the removal device toward the conductive pathway to scrape, remove, and/or perturb contaminants on the conductive pathway in the conduction impaired location. While the removal device is only shown above the vehicle system in FIG. 2, alternatively, this removal device or an additional removal device may be below the vehicle system and be extended below the vehicle system to scrape contaminants off the conductive pathway below the vehicle system.

The actuator(s) and/or controller may limit how far the collector device and/or removal device is moved away from the vehicle and/or toward the conductive pathway to limit or prevent damage to the conductive pathway, the collector device, and/or the actuator. For example, raising a pantograph too far or lowering a conductive shoe too far can impart too great a force on the conductive pathway, the pantograph, the conductive shoe, and/or the actuator(s). This force may damage or break the conductive pathway, the pantograph, the conductive shoe, and/or the actuator(s). To prevent this damage, the controller and/or actuator(s) may be limited by one or more of the sensors shown in FIG. 2. These sensors may include displacement sensors that measure how far the collector device and/or removal device has moved away from the vehicle. The controller and/or actuator may prevent movement of or not move the collector device and/or removal device to a distance threshold 224 away from (e.g., above or below, as appropriate) the vehicle system. This distance threshold can be selected as a safe distance that the collector device and/or removal device can move away from the vehicle system without damaging the conductive pathway, the collector device, the removal device, and/or the actuator. The distance threshold may be based on an average or median distance that the conductive pathway is away from the top (or bottom) of the vehicle system. While the distance threshold is only shown above the vehicle system in FIG. 2, a similar distance threshold may extend below the vehicle system for the conductive shoe.

The sensors may include force sensors that measure the force imparted on the collector device or removal device by the conductive pathway, or the force imparted on the conductive pathway by the collector device or the removal device. The controller and/or actuator may move the collector device and/or removal device until the sensed force imparted by or on the collector device and/or removal device reaches a threshold force. The controller and/or actuator may then stop and prevent further movement of the collector device and/or removal device away from the vehicle system. This threshold force can be selected as a safe force that will not damage the collector device, the removal device, the actuator, and/or the conductive pathway.

The controller may raise or lower the collector device (as appropriate) to the designated distance or distance threshold to scrape or otherwise perturb the contaminants on the conductive pathway. Prior to moving the collector device to this distance away from the vehicle system, the controller may open the switches between the collector device and the loads and/or propulsion system of the vehicle system. The loads and/or propulsion system can then be powered using energy from the onboard energy source. Opening these switches can prevent energy (e.g., voltage) conducted in the conductive pathway from suddenly being conducted to the loads and/or propulsion system once the contaminant is removed and/or the conduction impaired location is passed by the vehicle system.

Optionally, the controller can continue monitoring output from the sensor measuring the energy of the conductive pathway while the switches between the collector device and the loads and/or propulsion system are open. For example, the controller can open the switches between (a) the pantograph or the conductive shoe and (b) the loads and/or propulsion system, raise the pantograph or lower the conductive show to the designated distance away from the vehicle system, and continue monitoring the voltage conducted in the conductive pathway using the sensors. Responsive to detecting voltage (e.g., above a designated threshold, above a median or average of prior measurements of the conductive pathway, etc.), the controller can determine that the collector device is no longer contacting a conduction impaired location of the conductive pathway. Raising or lowering the collector device to the threshold distance away from the vehicle system can ensure that the conductive pathway will contact the conductive pathway, whereas merely monitoring the voltage conducted in the conductive pathway (e.g., to determine whether the collector device is in contact with the conductive pathway) may be inaccurate due to contaminants on the conductive pathway.

As another example of conditioning the conductive pathway responsive to identifying the conduction impaired segment of the conductive pathway, the controller can control the collector device to heat a portion of the conductive pathway. For example, the controller can direct heat to the contaminated portion of the conductive pathway at the conduction impaired location via the collector device and/or the removal device. The collector device and/or the removal device can include one or more resistive elements (e.g., resistors, wires with reduced diameter (relative to other portions of the collector device and/or removal device), etc., that generate heat sufficient to melt ice, burn or otherwise remove contaminants, etc. from the conductive pathway while a voltage or current is conducted through the elements. The controller may close one or more switches between (a) the onboard energy source and (b) the collector device and/or the removal device to generate heat via the collector device and/or the removal device using energy (e.g., voltage or current) from the onboard energy source. In one example, some (but less than all) of the energy stored in or generated by the onboard energy source is used to generate heat via the collector device and/or removal device, while another portion (but less than all) of the energy from the onboard energy source is used to power the propulsion system to keep the vehicle system moving through the conduction impaired segment of the conductive pathway.

As another example of conditioning the conductive pathway responsive to identifying the conduction impaired segment of the conductive pathway, the controller can control the collector device to heat a portion of the conductive pathway. For example, the controller can direct heat to the contaminated portion of the conductive pathway at the conduction impaired location via the collector device and/or the removal device. The collector device and/or the removal device can include one or more resistive elements (e.g., resistors, wires with reduced diameter (relative to other portions of the collector device and/or removal device), etc., that generate heat sufficient to melt ice, burn or otherwise remove contaminants, etc. from the conductive pathway while a voltage or current is conducted through the elements. The controller may close one or more switches between (a) the onboard energy source and (b) the collector device and/or the removal device to generate heat via the collector device and/or the removal device using energy (e.g., voltage or current) from the onboard energy source. In one example, some (but less than all) of the energy stored in or generated by the onboard energy source is used to generate heat via the collector device and/or removal device, while another portion (but less than all) of the energy from the onboard energy source is used to power the propulsion system to keep the vehicle system moving through the conduction impaired segment of the conductive pathway.

As another example of conditioning the conductive pathway responsive to identifying the conduction impaired segment of the conductive pathway, the controller can control the collector device or removal device to generate an electric arc 228 between (a) the collector device or the removal device and (b) the conductive pathway. The arc may be generated as a visible or invisible discharge of plasma between the conductive pathway and the collector device caused by ionization of gas in the air or space between the collector device or the removal device and the conductive pathway. The controller can direct the onboard energy source to provide voltage or current to the removal device and/or collector device at the conduction impaired location. The arc may be created by a discontinuity in the conductivity of the conductive pathway, such as the discontinuity caused by the conduction impaired segment of the conductive pathway. The controller can create and maintain the arc by directing the onboard energy source to maintain the voltage conducted by the onboard energy source to a level or amount that is less than the voltage conducted along the conductive pathway (e.g., the median or average voltage conducted in the conductive pathway).

The controller may change an operating mode of the vehicle system or make sure that the vehicle system is functioning in a designated operating mode before conditioning the conductive pathway. This operating mode may require that the vehicle system not be braking or engaging brakes while conditioning or initiating conditioning of the conductive pathway, that the vehicle system is propelling itself (and not coasting downhill, in idle, or otherwise not generating torque or propulsive force to move the vehicle system), the collector device is not engaging the conductive pathway, and/or that circuitry of the vehicle system is not receiving voltage or current at or above a designated safety threshold. If one or more of these criteria is not met, the controller may change the state or operation of the component(s) to place the vehicle system in a mode that does meet the criteria and/or the controller may prevent conditioning of the conductive pathway.

The controller can control the vehicle system to condition the conductive pathway while the vehicle system is moving downhill or uphill in one embodiment. The controller may not require additional energy from the onboard energy source to propel the vehicle system during downhill movement while the vehicle system is conditioning the conductive pathway.

While several examples of controlling the vehicle and/or conditioning the conductive pathway are provided, these examples are not mutually exclusive in one embodiment. For example, two or more (or all) of the different ways of controlling the vehicle and/or conditioning the conductive pathway as described herein may be used concurrently, simultaneously, sequentially, etc. For example, the vehicle system may move the collector device away from the vehicle system to the designated distance to scrape or perturb contaminants on the conductive pathway while also heating the conductive pathway and/or creating an electric arc.

The controller may control how the energy drawn from the conductive pathway is used to ensure that the amount of energy does not damage one or more components onboard the vehicle. For example, once the contaminants from the conductive pathway are removed or the collector device is no longer within a conduction impaired segment of the conductive pathway, the amount of voltage conducted from the conductive pathway to the collector device may suddenly increase. If the onboard energy source also is supplying energy (e.g., voltage or current) to onboard components of the vehicle system (e.g., the loads and/or propulsion system), then the combination of the energy from the onboard source and the energy from the conductive pathway via the collector device may exceed one or more safe thresholds for operation of the components. This may result in electrical damage to one or more of the loads and/or propulsion system, especially in situations where the sudden increase in the energy is faster than a circuit breaker or other switch can react.

As one example, the switches between (a) the collector device and (b) the loads and the propulsion system and the switches between (c) the onboard energy source and (d) the loads and the propulsion system shown in FIG. 2 may represent several switches, choppers, or the like, that can be individually controlled to control how much energy (voltage or current) is conducted to the loads and propulsion system from the collector device and/or the onboard energy source, respectively. The controller can control one or more of these switches to increase the energy drawn by the vehicle system from the conductive pathway as the contaminants are removed from the conductive pathway and/or the conduction impaired portion is passed by the collector device. This can involve closing one or more (or all) of the switches between the collector device and the loads/propulsion system, increasing how many of these switches are closed at one time (e.g., via duty cycling the switches), etc. The controller can close one or more (or all) of these switches while the onboard energy source continues to provide energy to the loads/propulsion system.

The controller can prevent a significant change in the total energy obtained from a combination of the conductive pathway and the onboard energy source from damaging the loads/propulsion system by directing at least some of the energy to one or more dissipating resistive elements 230 ("Grid" in FIG. 2) onboard the vehicle system (e.g., via one or more of the switches). The resistive elements may be a resistive grid, dynamic brake grids, resistive plates, etc., that can convert the energy directed to the resistive elements to heat. For example, the controller can monitor the current or voltage drawn by the collector device from the conductive pathway and close a switch between the collector device and the resistive elements responsive to the monitored current or voltage exceeding a threshold current or voltage. Responsive to this monitored current or voltage not exceeding or no longer exceeding the threshold, the controller can open one or more of the switches between the resistive elements and the collector device to reduce or stop conduction of the current or voltage (received from the conductive pathway) to the resistive elements.

The controller can continue to open or close switches to conduct or stop conduction of current or voltage from the conductive pathway to the resistive elements responsive to the current or voltage exceeding the threshold. This may occur only while the onboard energy source is supplying energy to the loads and/or propulsion system, or may occur regardless of whether the onboard energy source is supplying energy to the loads and/or propulsion system.

The controller can additionally or alternatively control the onboard energy source to control or limit how much energy is directed to the loads and/or propulsion system (from a combination of the conductive pathway and the onboard energy source). For example, during times that the energy from the conductive pathway is reduced (e.g., due to contaminants or other causes of a conduction impaired location), the controller can direct the onboard energy source to generate more energy. This can involve directing more voltage to be supplied from batteries, fuel cells, etc.; directing an engine to operate at greater speeds; etc. As the energy from the conductive pathway increases (e.g., due to fewer or no contaminants or other causes of a conduction impaired location), the controller can direct the onboard energy source to generate less energy. This can involve directing less voltage to be supplied from batteries, fuel cells, etc.; directing the engine to operate at slower speeds; etc.

The controller can notify one or more other systems of detection of a conduction impaired location. For example, responsive to identifying a conduction impaired location, the controller can send a signal to the off-board system or another vehicle using the communication pathway. This signal can cause or direct the off-board system to send maintenance personnel to inspect, repair, or maintain the conductive pathway or route (e.g., to reduce or eliminate dips in the route, or otherwise repair a bed of the route), to warn other vehicle systems, to route other vehicle systems to avoid the conduction impaired location, etc. The other vehicle systems can change operation responsive to receiving the signal, such as by moving to another route to avoid the conduction impaired location, storing additional energy onboard the vehicle systems to allow the vehicle systems to have enough energy to move through the conduction impaired location, changing operation on the onboard energy source to account for the upcoming conduction impaired location, preparing to condition the conduction impaired location that was reported, etc.

In one example, the off-board system or the vehicle system that detected the conduction impaired location can report this location to the other vehicle systems via notification signals. The other vehicle systems can receive the notification signals and be directed by the off-board system, by an onboard operator, and/or by an autonomous controller to move to the reported location and examine characteristics of the conductive pathway at or near (e.g., within a threshold distance, such as two hundred fifty meters) the reported locations. For example, the other vehicle systems can examine the voltage (or current) conducted from the conductive pathway, can examine the ambient temperature and/or humidity, can examine optical sensor output, etc. at, ahead of, and/or behind the reported conduction impaired location that was reported. The other vehicle systems can perform this examination and report back to other vehicle systems or the off-board system to confirm or refute the prior identification of the conduction impaired location. Optionally, the vehicle systems may be directed to mechanically, electrically, and/or thermally clear contaminants from the conductive pathway at the conduction impaired location that was reported. The vehicle systems may perform this clearance as described above (e.g., by scraping the conductive pathway, creating an electric arc, and/or heating the conductive pathway) with or without performing additional sensing of the conductive pathway to determine whether there are contaminants on the conductive pathway in different embodiments.

The off-board system optionally can control how often or how frequently the conductive pathway is conditioned by vehicle systems based on environmental conditions to proactively remove contaminants from the conductive pathway. This can help prevent buildup of contaminants that otherwise would or could result in creating conduction impaired locations along the conductive pathway. For example, the off-board system can represent or include a dispatch system that dictates where and/or when different vehicle systems travel along the routes. The off-board system can monitor weather conditions to identify locations where temperatures are colder than the threshold temperature, humidity is greater than the threshold humidity, wind speed is faster than a threshold speed, air particulates are in the air at a density greater than a threshold density, or the like. For areas having colder temperatures, greater humidity, faster wind, greater air particulate densities, etc., the off-board system can direct vehicle systems to inspect and/or condition the conductive pathway more often (relative to or compared with other areas having warmer temperatures, lesser humidity, slower wind, lesser air particulate density, etc.).

The off-board system can coordinate how different or separate vehicle systems operate to identify and condition conduction impaired locations of the conductive pathway. For example, a first vehicle system may condition the conductive pathway without using electric power (e.g., without heating the conductive pathway or creating an electric arc) and may measure the energy (e.g., voltage) conducted by the conductive pathway. If the energy of the conductive pathway (e.g., the peak or maximum measured voltage) does not exceed a threshold, then a second vehicle system may then be directed to condition the same portion of the conductive pathway but using electric power, such as to heat the conductive pathway or create the electric arc.

Figure 3:
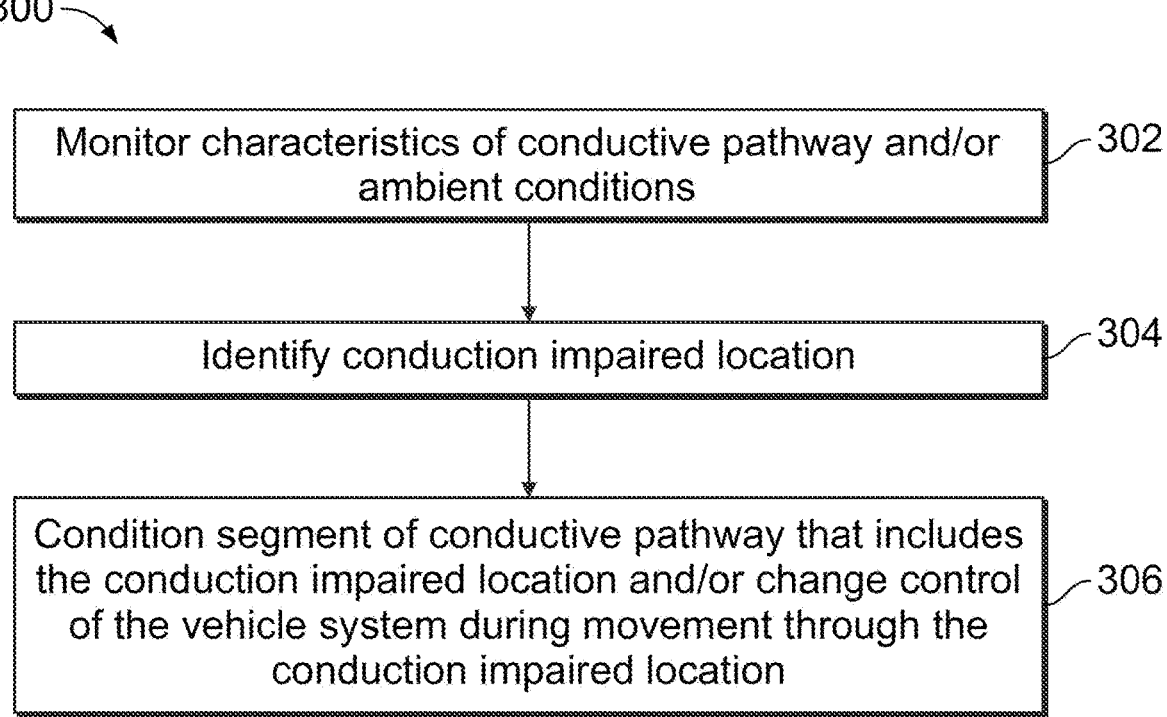
FIG. 3 illustrates a flowchart of one example of a method for controlling operation of a vehicle system to condition and/or move through a conduction impaired location of a conductive pathway.

FIG. 3 illustrates a flowchart of one example of a method 300 for controlling operation of a vehicle system to condition and/or move through a conduction impaired location of a conductive pathway. The method can represent operations performed by the control system described herein or another control system. At step 302, one or more characteristics of a conductive pathway and/or ambient conditions are monitored. For example, the vehicle system can measure the voltage conducted in the conductive pathway to identify changes (e.g., decreases) in the voltage. As another example, the vehicle system and/or off-board system can monitor weather conditions to determine whether the conditions are likely to cause contamination of the conductive pathway. At step 304, a conduction impaired location of the conductive pathway is identified based on the conditions and/or characteristics described above. At step 306, one or more responsive actions are implemented to condition the conductive pathway and/or control operation of the vehicle system, as described herein. The method may be repeated one or more times or may terminate after step 306.

In one embodiment, the control system may have a local data collection system deployed that may use machine learning to enable derivation-based learning outcomes. The controller may learn from and make decisions on a set of data (including data provided by the various sensors), by making data-driven predictions and adapting according to the set of data. In embodiments, machine learning may involve performing a plurality of machine learning tasks by machine learning systems, such as supervised learning, unsupervised learning, and reinforcement learning. Supervised learning may include presenting a set of example inputs and desired outputs to the machine learning systems. Unsupervised learning may include the learning algorithm structuring its input by methods such as pattern detection and/or feature learning. Reinforcement learning may include the machine learning systems performing in a dynamic environment and then providing feedback about correct and incorrect decisions. In examples, machine learning may include a plurality of other tasks based on an output of the machine learning system. In examples, the tasks may be machine learning problems such as classification, regression, clustering, density estimation, dimensionality reduction, anomaly detection, and the like. In examples, machine learning may include a plurality of mathematical and statistical techniques. In examples, the many types of machine learning algorithms may include decision tree based learning, association rule learning, deep learning, artificial neural networks, genetic learning algorithms, inductive logic programming, support vector machines (SVMs), Bayesian network, reinforcement learning, representation learning, rule-based machine learning, sparse dictionary learning, similarity and metric learning, learning classifier systems (LCS), logistic regression, random forest, K-Means, gradient boost, K-nearest neighbors (KNN), a priori algorithms, and the like. In embodiments, certain machine learning algorithms may be used (e.g., for solving both constrained and unconstrained optimization problems that may be based on natural selection). In an example, the algorithm may be used to address problems of mixed integer programming, where some components restricted to being integer valued. Algorithms and machine learning techniques and systems may be used in computational intelligence systems, computer vision, Natural Language Processing (NLP), recommender systems, reinforcement learning, building graphical models, and the like. In an example, machine learning may be used for vehicle performance and behavior analytics, and the like.

In one embodiment, the control system may include a policy engine that may apply one or more policies. These policies may be based at least in part on characteristics of a given item of equipment or environment. With respect to control policies, a neural network can receive input of a number of environmental and task-related parameters. These parameters may include voltage or current measurements of the conductive pathway, measured ambient temperatures, measured ambient humidity, measured air particulate densities, etc. The neural network can be trained to generate an output based on these inputs, with the output representing an action or sequence of actions that the vehicle group should take. For example, based on these parameters, the neural network can determine whether a section of the conductive pathway is likely to have a conductive impaired location. During operation of one embodiment, a determination can occur by processing the inputs through the parameters of the neural network to generate a value at the output node designating that action as the desired action. This action may translate into a signal that causes the vehicle system to operate, as described herein. This may be accomplished via back-propagation, feed forward processes, closed loop feedback, or open loop feedback. Alternatively, rather than using backpropagation, the machine learning system of the controller may use evolution strategies techniques to tune various parameters of the artificial neural network. The controller may use neural network architectures with functions that may not always be solvable using backpropagation, for example functions that are non-convex. In one embodiment, the neural network has a set of parameters representing weights of its node connections. A number of copies of this network are generated and then different adjustments to the parameters are made, and simulations are done. Once the output from the various models are obtained, they may be evaluated on their performance using a determined success metric. The best model is selected, and the vehicle controller executes that plan to achieve the desired input data to mirror the predicted best outcome scenario. Additionally, the success metric may be a combination of the optimized outcomes, which may be weighed relative to each other.

The controller can use this artificial intelligence or machine learning to receive input (e.g., measured characteristics of a conductive pathway and/or ambient conditions), use a model that associates these characteristics and/or conditions with different likelihoods of conduction impaired locations to select an operating mode of the vehicle system. An output can then be provided (e.g., the operating mode that is selected, the manner in which the conductive pathway is to be conditioned, etc., using the model). The controller may receive additional input of the operating mode that was selected, an indication of whether the contaminant(s) were removed from the conductive pathway, a subsequent measurement of the voltage or current conducted by the conductive pathway (e.g., after conditioning the conductive pathway), operator input, or the like, that indicates whether the operating mode or other output provided a desirable outcome or not. Based on this additional input, the controller can change the model, such as by changing which operating mode would be selected and/or whether a conduction impaired location would be identified when similar or identical input is provided the next time or iteration. The controller can then use the changed or updated model again to select an operating mode, determine whether a conduction impaired location is likely to exist, receive feedback, change or update the model again, etc., in additional iterations to repeatedly improve or change the model using artificial intelligence or machine learning.

In one example, a method for controlling operation of a vehicle system is provided. This vehicle system can be at least partially powered by electric current conducted to a collector device of the vehicle system from a conductive pathway extending along a route traveled by the vehicle system. The method may include monitoring a voltage level of the conductive pathway and identifying a conduction impaired location of the conductive pathway based at least in part on the voltage level of the conductive pathway that is monitored. The method also may include controlling the collector device or a removal device to remove a contaminant from the conductive pathway at the conduction impaired location, controlling the vehicle system to compensate for the conduction impaired location, and/or notifying at least one of an off-board facility or another vehicle system of the conduction impaired location responsive to identifying the conduction impaired location.

The voltage level of the electric current may be monitored by measuring a voltage conducted by the conductive pathway at different locations. The vehicle system may be controlled to compensate for the conduction impaired location by controlling the vehicle system to compensate for a change in a grade of the route at the conduction impaired location. The vehicle system may be controlled to compensate for the change in the grade of the route by supplying a propulsion system of the vehicle system with electric current supplied by an onboard energy source.

The collector device, the vehicle system, or both the vehicle and the collector device may be at least partially operated using electric current generated by an onboard energy source of the vehicle system. The collector device or the removal device may be controlled by raising the collector device or the removal device to an upper determined position to engage the conductive pathway above and away from the vehicle system or lowering the collector device or the removal device to a lower determined position to engage the conductive pathway below and away from the vehicle system. The collector device or the removal device may be raised or lowered to mechanically scrape or perturb the contaminant on the conductive pathway and thereby remove at least a portion of the contaminant from the conductive pathway. The method also may include opening one or more switches between the collector device and one or more loads onboard the vehicle system prior to or while raising the collector device or the removal device to the upper determined position or lowering the collector device or the removal device to the lower determined position.

The method also may include monitoring the voltage level conducted on the conductive pathway while the collector device or the removal device is raised to the upper limit position or lowered to the lower limit position. The method also may include switching between a first mode in which the vehicle system is powered at least partially using the voltage conducted from the conductive pathway and a second mode in which the vehicle system is at least partially powered using electric current supplied from an onboard energy source of the vehicle system. Switching between the first mode and the second mode may occur responsive to the voltage level that is monitored being less than or exceeding one or more voltage thresholds.

The method also may include heating a portion of the conductive pathway at the conduction impaired location using the collector device or the removal device. Heating the portion of the conducive pathway may be accomplished using additional electric current stored or generated onboard the vehicle system.

The method may include generating an electric arc between the collector device and the conductive pathway that at least partially removes the contaminant from the conductive pathway. The electric arc may be created by maintaining a voltage conducted by an onboard energy source of the vehicle system to less than the voltage conducted by the conductive pathway. The vehicle may be controlled by increasing an amount of the electric current drawn by the vehicle from the conductive pathway, directing at least a portion of the electric current to one or more dissipating resistive elements onboard the vehicle while the amount of the electric current drawn from the conductive pathway exceeds a threshold current, and directing the electric current to one or more vehicle loads while the amount of the electric current drawn from the conductive pathway does not exceed the threshold current.

The vehicle system may be controlled by maintaining a speed of an engine of the vehicle system above a designated threshold associated with a voltage difference between the voltage level of the conductive pathway and a voltage supplied by an onboard energy source of the vehicle system. The conduction impaired location may be identified by an off-board facility, another vehicle system, or a prior passage of the vehicle system along the conductive pathway. The conduction impaired location may be identified by detecting one or more of an ambient temperature falling below a threshold temperature or a change in the voltage level of the conductive pathway. The method may include notifying the at least one of the off-board facility or the other vehicle system of the conduction impaired location of a route bed requiring repair, maintenance, or inspection.

In another example, another method is provided and includes receiving notifications from vehicle systems traveling along routes having conductive pathways extending along the routes. The notifications may identify locations along the conductive pathways or along the routes where decreases in voltage conducted along the conductive pathways were sensed by the vehicle systems. The method also may include examining one or more characteristics of the voltage or the decreases in the voltage that were sensed by the vehicle systems, and directing the vehicle systems or one or more additional vehicles how to move through at least one of the locations that were identified based on the one or more characteristics of the voltage or the decreases in the voltage.

In another example, a vehicle control system is provided that may include a sensor or receive information from the sensor onboard a vehicle system (without the control system including the sensor) to monitor a voltage conducted along a conductive pathway extending along a route while the vehicle system moves along the route. The sensor may monitor the voltage conducted along the conductive pathway that also powers a propulsion system of the vehicle system via a collector device of the vehicle system. The control system may include a controller that may identify a conduction impaired segment of the conductive pathway based on the voltage that is monitored by the sensor. The controller may control the collector device to remove a contaminant on the conducive pathway, control a removal device of the vehicle system to remove the contaminant on the conducive pathway, control the vehicle system to power the propulsion system using a different energy source than the conductive pathway, and/or control the vehicle system to account for a change in grade of the route, responsive to identifying the conduction impaired segment of the conductive pathway.

Use of phrases such as "one or more of . . . and," "one or more of . . . or," "at least one of . . . and," and "at least one of . . . or" are meant to encompass including only a single one of the items used in connection with the phrase, at least one of each one of the items used in connection with the phrase, or multiple ones of any or each of the items used in connection with the phrase. For example, "one or more of A, B, and C," "one or more of A, B, or C," "at least one of A, B, and C," and "at least one of A, B, or C" each can mean (1) at least one A, (2) at least one B, (3) at least one C, (4) at least one A and at least one B, (5) at least one A, at least one B, and at least one C, (6) at least one B and at least one C, or (7) at least one A and at least one C.

As used herein, an element or step recited in the singular and preceded with the word "a" or "an" do not exclude the plural of said elements or operations, unless such exclusion is explicitly stated. Furthermore, references to "one embodiment" of the invention do not exclude the existence of additional embodiments that incorporate the recited features. Moreover, unless explicitly stated to the contrary, embodiments "comprising," "comprises," "including," "includes," "having," or "has" an element or a plurality of elements having a particular property may include additional such elements not having that property. In the appended claims, the terms "including" and "in which" are used as the plain-English equivalents of the respective terms "comprising" and "wherein." Moreover, in the following claims, the terms "first," "second," and "third," etc. are used merely as labels, and do not impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function devoid of further structure.

The above description is illustrative, and not restrictive. For example, the above-described embodiments (and/or aspects thereof) may be used in combination with each other. In addition, many modifications may be made to adapt a particular situation or material to the teachings of the subject matter without departing from its scope. While the dimensions and types of materials described herein define the parameters of the subject matter, they are exemplary embodiments. Other embodiments will be apparent to one of ordinary skill in the art upon reviewing the above description. The scope of the subject matter should, therefore, be determined with reference to the appended claims, along with the full scope of equivalents to which such claims are entitled.

This written description uses examples to disclose several embodiments of the subject matter, including the best mode, and to enable one of ordinary skill in the art to practice the embodiments of subject matter, including making and using any devices or systems and performing any incorporated methods. The patentable scope of the subject matter is defined by the claims, and may include other examples that occur to one of ordinary skill in the art. Such other examples are intended to be within the scope of the claims if they have structural elements that do not differ from the literal language of the claims, or if they include equivalent structural elements with insubstantial differences from the literal languages of the claims.

What is claimed is:

1. A method for controlling operation of a vehicle system configured to be at least partially powered by electric current conducted to a collector device of the vehicle system from a conductive pathway extending along a route traveled by the vehicle system, the method comprising:

monitoring a voltage level of the conductive pathway;

identifying a conduction impaired location of the conductive pathway based at least in part on the voltage level of the conductive pathway that is monitored; and controlling the collector device or a removal device to remove a contaminant from the conductive pathway at the conduction impaired location in response to identifying the conduction impaired location, wherein the collector device or the removal device is controlled by raising the collector device or the removal device to an upper determined position to engage the conductive pathway above and away from the vehicle system or lowering the collector device or the removal device to a lower determined position to engage the conductive pathway below and away from the vehicle system, the collector device or the removal device being raised or lowered to mechanically scrape or perturb the contaminant on the conductive pathway and thereby remove at least a portion of the contaminant from the conductive pathway.

2. The method of claim 1, wherein the voltage level of the electric current is monitored by measuring a voltage conducted by the conductive pathway at different locations.

3. The method of claim 1, further comprising controlling the vehicle system to compensate for the conduction impaired location in response to identifying the conduction impaired location.

4. The method of claim 3, wherein the vehicle system is controlled to compensate for the change in the grade of the route by supplying a propulsion system of the vehicle system with electric current supplied by an onboard energy source.

5. The method of claim 1, wherein the collector device, the vehicle system, or both the vehicle and the collector device are at least partially operated using electric current generated by an onboard energy source of the vehicle system.

6. The method of claim 1, further comprising opening one or more switches between the collector device and one or more loads onboard the vehicle system prior to or while raising the collector device or the removal device to the upper determined position or lowering the collector device or the removal device to the lower determined position.

7. The method of claim 1, further comprising monitoring the voltage level conducted on the conductive pathway while the collector device or the removal device is raised to the upper determined position or lowered to the lower determined position.

8. The method of claim 1, further comprising switching between a first mode in which the vehicle system is powered at least partially using the voltage conducted from the conductive pathway and a second mode in which the vehicle system is at least partially powered using electric current supplied from an onboard energy source of the vehicle system, wherein switching between the first mode and the second mode occurs responsive to the voltage level that is monitored being less than or exceeding one or more voltage thresholds.

9. The method of claim 1, further comprising heating a portion of the conductive pathway at the conduction impaired location using the collector device or the removal device.

10. The method of claim 9, wherein heating the portion of the conducive pathway is accomplished using additional electric current stored or generated onboard the vehicle system.

11. A method for controlling operation of a vehicle system configured to be at least partially powered by electric current conducted to a collector device of the vehicle system from a conductive pathway extending along a route traveled by the vehicle system, the method comprising:

monitoring a voltage level of the conductive pathway;

identifying a conduction impaired location of the conductive pathway based at least in part on the voltage level of the conductive pathway that is monitored; and one or more of:

(a) controlling the collector device or a removal device to remove a contaminant from the conductive pathway at the conduction impaired location;

(b) controlling the vehicle system to compensate for the conduction impaired location; or (c) notifying at least one of an off-board facility or another vehicle system of the conduction impaired location responsive to identifying the conduction impaired location, the method further comprising creating an electric arc between the collector device and the conductive pathway that at least partially removes the contaminant from the conductive pathway.

12. The method of claim 11, wherein the electric arc is created by maintaining a voltage conducted by an onboard energy source of the vehicle system to less than the voltage conducted by the conductive pathway.

13. The method of claim 1, wherein the vehicle is controlled by increasing an amount of the electric current drawn by the vehicle from the conductive pathway, directing at least a portion of the electric current to one or more dissipating resistive elements onboard the vehicle while the amount of the electric current drawn from the conductive pathway exceeds a threshold current, and directing the electric current to one or more vehicle loads while the amount of the electric current drawn from the conductive pathway does not exceed the threshold current.

14. The method of claim 1, wherein the vehicle system is controlled by maintaining a speed of an engine of the vehicle system above a designated threshold associated with a voltage difference between the voltage level of the conductive pathway and a voltage supplied by an onboard energy source of the vehicle system.

15. The method of claim 1, wherein the conduction impaired location is identified by an off-board facility, another vehicle system, or a prior passage of the vehicle system along the conductive pathway.

16. The method of claim 1, wherein the conduction impaired location is identified by detecting one or more of an ambient temperature falling below a threshold temperature or a change in the voltage level of the conductive pathway.

17. The method of claim 1, wherein the method includes notifying at least one of an off-board facility or another vehicle system of the conduction impaired location responsive to identifying the conduction impaired location.

18. A vehicle control system comprising:

a sensor configured to be disposed onboard a vehicle system and monitor a voltage conducted along a conductive pathway extending along a route while the vehicle system moves along the route, the sensor configured to monitor the voltage conducted along the conductive pathway that also powers a propulsion system of the vehicle system via a collector device of the vehicle system; and a controller configured to identify a conduction impaired segment of the conductive pathway based on the voltage that is monitored by the sensor, the controller configured to control the collector device or a removal device to remove a contaminant on the conductive pathway in response to identifying the conduction impaired segment of the conductive pathway, wherein the collector device or the removal device is controlled by raising the collector device or the removal device to an upper determined position to engage the conductive pathway above and away from the vehicle system or lowering the collector device or the removal device to a lower determined position to engage the conductive pathway below and away from the vehicle system, the collector device or the removal device being raised or lowered to mechanically scrape or perturb the contaminant on the conductive pathway and thereby remove at least a portion of the contaminant from the conductive pathway.

* * * * *